United States Patent
Klaver et al.

(10) Patent No.: US 7,902,494 B2
(45) Date of Patent: Mar. 8, 2011

(54) SYSTEM FOR DETECTING MOTION OF A BODY

(75) Inventors: Ronatus Gerardus Klaver, Eindhoven (NL); Theo Anjes Maria Ruijl, Oirschol (NL); Michael Josepha Mathijs Renkens, Sittard (NL); Jan Van Eijk, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/067,358

(22) PCT Filed: Sep. 13, 2006

(86) PCT No.: PCT/IB2006/053267
§ 371 (c)(1),
(2), (4) Date: Jul. 10, 2008

(87) PCT Pub. No.: WO2007/034379
PCT Pub. Date: Mar. 29, 2007

(65) Prior Publication Data
US 2009/0001260 A1  Jan. 1, 2009

Related U.S. Application Data

(60) Provisional application No. 60/718,990, filed on Sep. 21, 2005.

(51) Int. Cl.
*G01D 5/38* (2006.01)
*G03F 9/00* (2006.01)
(52) U.S. Cl. .................. 250/237 G; 250/559.3; 356/401
(58) Field of Classification Search ............. 250/237 G, 250/559.3; 356/401, 646, 620, 616
See application file for complete search history.

(56) References Cited

U.S. PATENT DOCUMENTS

| | | | |
|---|---|---|---|
| 3,230,380 A | | 1/1966 | Cooke |
| 4,820,055 A * | | 4/1989 | Muller .......................... 356/401 |
| 5,144,363 A * | | 9/1992 | Wittekoek et al. .............. 355/53 |
| 5,652,426 A * | | 7/1997 | Maeda ...................... 250/237 G |
| 5,657,125 A * | | 8/1997 | Kato et al. ..................... 356/499 |
| 5,738,825 A | | 4/1998 | Rudigier |
| 5,748,373 A * | | 5/1998 | Hane et al. .................... 359/575 |
| 5,880,839 A * | | 3/1999 | Ishizuka et al. ............... 356/499 |
| 5,910,847 A * | | 6/1999 | Van der Werf et al. ....... 356/401 |
| 6,297,876 B1* | | 10/2001 | Bornebroek .................... 355/67 |
| 6,476,405 B1* | | 11/2002 | Henshaw ................. 250/559.29 |
| 6,603,561 B2* | | 8/2003 | Ditto ............................ 356/486 |
| 6,937,334 B2* | | 8/2005 | Monshouwer et al. ....... 356/399 |
| 6,937,344 B2* | | 8/2005 | Monshouwer et al. ....... 356/508 |
| 6,961,490 B2* | | 11/2005 | Maisenhoelder et al. ...... 385/37 |
| 7,057,161 B2* | | 6/2006 | Gruber et al. ............ 250/231.14 |
| 7,214,930 B2* | | 5/2007 | Schmitt .................... 250/231.13 |
| 7,247,843 B1* | | 7/2007 | Moon ........................ 250/237 G |
| 2003/0179373 A1* | | 9/2003 | Magnusson et al. .......... 356/328 |
| 2004/0165194 A1* | | 8/2004 | Hansen ......................... 356/521 |

(Continued)

FOREIGN PATENT DOCUMENTS

JP    2001289674 A1   10/2001

(Continued)

*Primary Examiner* — John R Lee

(57) ABSTRACT

The invention relates to a system (1) for detecting motion of a body (2) comprising a first elongated grating strip (4) coupled to said body and a separate and substantially stationary second elongated grating strip (5) crossing said first elongated grating strip. The system further comprises optical detection means (6) arranged to receive one or more light beams diffracted at said first and second elongated grating strips to detect motion of said body. The invention further relates to a method for detecting motion of a body (2) and to a body processing or inspection system.

21 Claims, 13 Drawing Sheets

U.S. PATENT DOCUMENTS

| | | | |
|---|---|---|---|
| 2004/0179184 A1* | 9/2004 | Levasier et al. | 355/75 |
| 2004/0233443 A1* | 11/2004 | Mieher et al. | 356/401 |
| 2007/0114678 A1* | 5/2007 | Van Haren et al. | 257/797 |
| 2007/0132996 A1* | 6/2007 | Van Haren et al. | 356/401 |
| 2008/0002213 A1* | 1/2008 | Weiss | 356/620 |
| 2009/0001260 A1* | 1/2009 | Klaver et al. | 250/237 G |

FOREIGN PATENT DOCUMENTS

| | | |
|---|---|---|
| WO | WO9839689 A1 | 9/1998 |
| WO | WO0192821 A1 | 12/2001 |

* cited by examiner

SYSTEM FOR DETECTING MOTION OF A BODY

The invention relates to a system for detecting motion of a body. More specifically, the invention relates to a system for optically detecting motion of a body, such as a wafer or a printed circuit board. The invention also relates to a body processing and/or inspection system and a method for detecting motion of a body. Finally, the invention relates to a grating for object motion detection purposes.

Accurate measurement of the position or position variations of moving bodies is required in various technological applications. As an example, lithographic projection tools and wafer inspection tools applied in the semiconductor industry require accurate information on position variations of semiconductor wafers. Another field of use involves the printed circuit board (PCB) industry, wherein information on the position of the PCB is desired during mounting components on a PCB, printing patterns on a PCB or inspection of PCB's.

Various optical measurement systems exist employing gratings to measure the displacement of an object. These systems comprise optical detection means including a light source, light detectors and a grating. The optical detection means is positioned at a distance above the grating. It depends on the optical detection means and the grating which types of motion (in-plane translation, in-plane rotation, out-of-plane translation, out-of-plane rotation) can be measured by the system.

In order to measure a single in-plane translation, the grating has a grating pattern that is periodic in the direction of that translation. For measuring both in-plane translations, a grating pattern that is periodic in the direction of both these translations is required. For applications wherein the translation is large, as compared to the spot size of the light source, the area covered by the grating should be large in order to detect translation over the full range of possible translations. This is particularly true for situations wherein both in-plane translations should be detected or measured.

Large gratings for measuring translations of a body may be disadvantageous in many respects for particular applications. A large grating may e.g. be difficult to manufacture, since the high accuracy periodicity of the grating pattern is difficult to accomplish over larger areas. Accordingly, the costs for such a grating are relatively high. Furthermore, a large grating claims valuable space in the system of the application. Moreover, in some applications, the grating is exposed to high accelerations and is required to possess negligible dimension variation characteristics resulting from temperature variations (low thermal expansion coefficient). Large and heavy gratings are therefore undesirable.

It is an object of the invention to provide an improved system and method for detecting motion of a body.

It is a further object of the invention to provide a system and method for detecting motion of a body reducing or eliminating at least one of the disadvantages of the prior art mentioned in the previous section.

It is a further object of the invention to provide a system and method for detecting motion of a body that allows application of a grating of reduced size.

The invention provides a system for detecting motion of a body comprising a first elongated grating strip coupled to said body and a separate and substantially stationary second elongated grating strip crossing said first elongated grating strip. The system further comprises optical detection means arranged to receive one or more light beams diffracted at said first and second elongated grating strips to detect motion of said body.

The invention further provides a method for detecting motion of a body in a system comprising a first elongated grating strip coupled to said body and a separate and substantially stationary second elongated grating strip crossing said first elongated grating strip. The system for application of the method comprises optical detection means. The method comprises the steps of:

providing an incident light beam to said first or second elongated grating strip, and receiving one or more light beams diffracted from said first and second elongated grating strip at said optical detection means to detect motion of said object.

The applicant has found that by using separate first and second gratings constituted as elongated strips that cross each other, motion can be detected for objects having large in-plane translation ranges by detecting or measuring the displacement of the first and second gratings relative to each other. Since only small strips are required, these strips can be manufactured more easily as compared to the large gratings of the prior art and, consequently, these grating strips are cheaper. Furthermore, the space claimed by the grating strips is less. It should be appreciated that the lengths of the grating strips is preferably about equal to or larger than the translation range of the object, whereas the width or transverse dimension preferably substantially equals the spot width of the light beam.

The embodiments of the invention as defined in claims 2 and 14 provide the advantage of enabling small optical detection means.

The embodiment of the invention as defined in claim 3 provides the advantage of a less complicated system, since the optical detection means are stationary, whereas the light redirection means can be accommodated relatively easily in the system.

The embodiment of the invention as defined in claim 4 has the advantage of optimal measurement flexibility.

The embodiment of the invention as defined in claim 5 allows detection or measurement of motion of the object of one or both in-plane translations.

The embodiments of the invention as defined in claim 6 and 15 allow determination of the direction of motion of the object and a reduced sensitivity to power fluctuations in the light beams while determining the phase of a light beam.

The embodiment of the invention as defined in claim 7 may eliminate or reduce the amount of optical components in the system, as the orientation the grating strips may influence the path of the light beams.

The embodiment of the invention as defined in claim 8 has the advantage of a large rotation range for the optical detection means. In particular, interfering light beams using a reflected by a retro-reflector will constitute a single spot on an optical detector allowing for easy detection of the phase as explained in more detail in this application.

The embodiment of the invention as defined in claim 9 allows light beams to be diffracted at both elongated gratings before being detected by the optical detection means. In particular, the use of a transmissive grating and a reflective grating allows light beams to pass an area where these grating overlap.

The embodiment of the invention as defined in claim 10 allows for a minimal length of the grating strips while having an optical in-plane translation detection range.

The embodiment of the invention as defined in claim 11 is advantageous in that small grating strips claim less space and can e.g. be disposed at or near the boundaries of the object of which motion is to be detected. The transverse dimension of the strips is preferably in the range of 1-10 mm, such as 5 mm.

Furthermore, the invention provides a body processing and/or inspection system comprising a processing and/or inspection chamber accommodating a body positioning table for said body, wherein a first elongated grating strip is mounted on said body positioning table. A second elongated grating strip crossing said first elongated grating strip is mounted substantially stationary with respect to said chamber. The first and second elongated grating strip and said optical detection means are arranged such that motion of said body positioning table can be detected. Preferably, the system is arranged for detecting motion by the method previously described.

Examples of such a body processing system include lithographic projection tools having a wafer stage for a semiconductor wafer. An example of a body inspection system includes wafer inspection tools, such as optical inspection tools, electron microscopes, atomic force microscopes etc. Typically these systems comprise multi-axis, laser interferometer based position measurement systems. The present invention enables a cost effective replacement for such multi-axis interferometer based systems. Other body processing and body inspection system include tools for mounting components or printing patterns on printed circuit boards and inspection of these boards, respectively. The applications are characterized by translations of the object that are large as compared to the diameter of the employed light beams.

The invention further provides an elongated grating strip comprising a grating pattern periodic in at least one direction, said elongated grating strip having a transverse dimension smaller than 15 mm, preferably smaller than 10 or 5 mm.

The embodiments of the invention as defined in claims 18 and 19 provided the advantage of allowing detection or measurement of both in-plane translations of a body.

The invention will be further illustrated with reference to the attached drawings, which schematically show preferred embodiments according to the invention. It will be understood that the invention is not in any way restricted to these specific and preferred embodiments.

Figure 1:
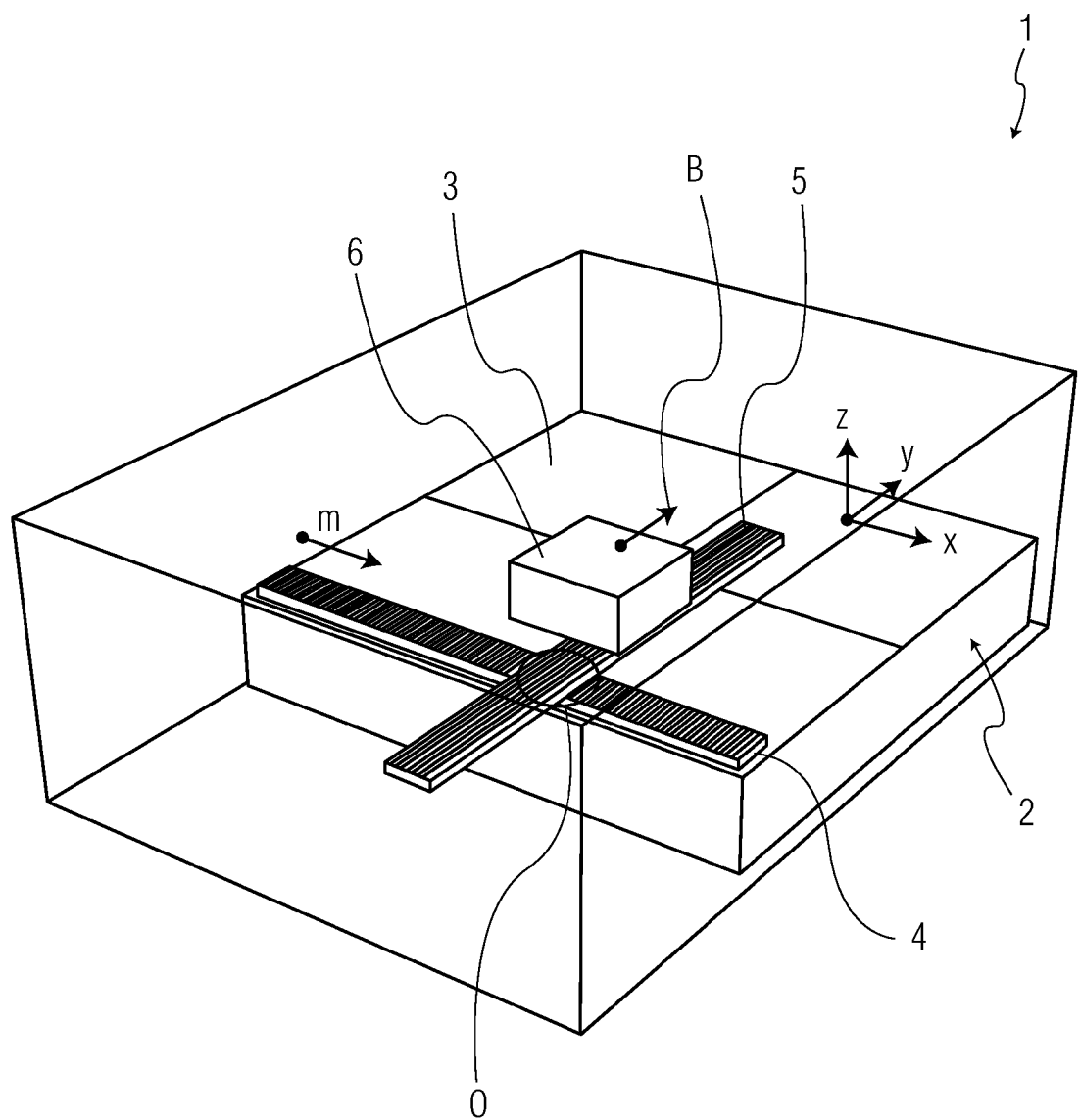
FIG. 1 shows a schematic representation of a system for detection motion of an object according to a first embodiment of the invention.
Figure 2:
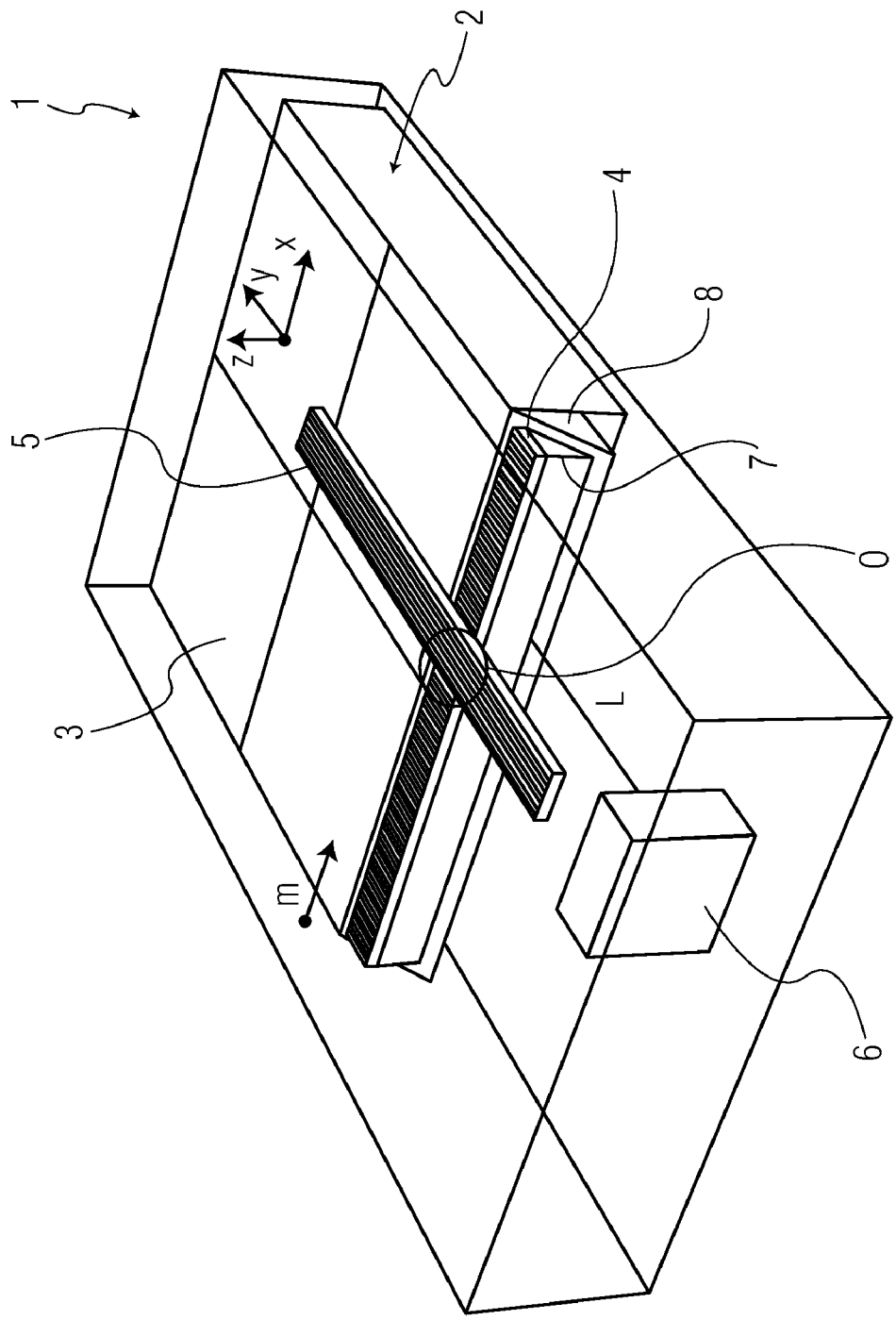
FIG. 2 shows a schematic representation of a system for detection motion of an object according to a second embodiment of the invention.
Figure 3:
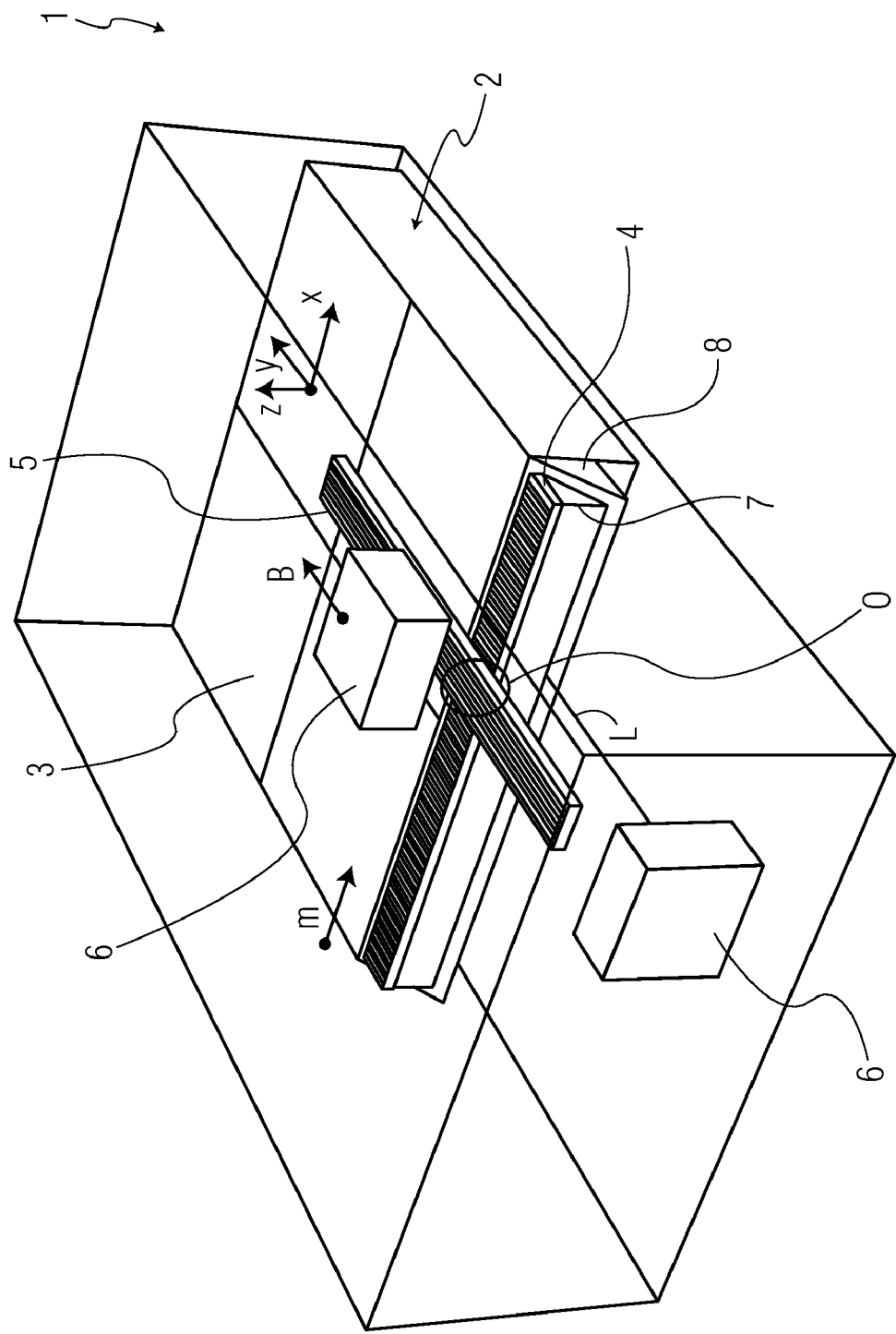
FIG. 3 shows a schematic representation of a system for detection motion of an object according to a third embodiment of the invention.
Figure 4A:
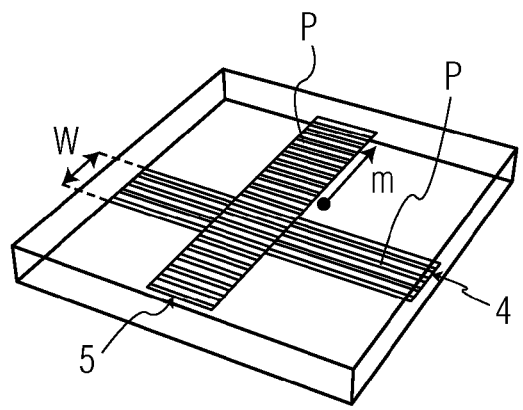
FIGS. 4A-4F show various types of first and second grating strips.
Figure 4B:
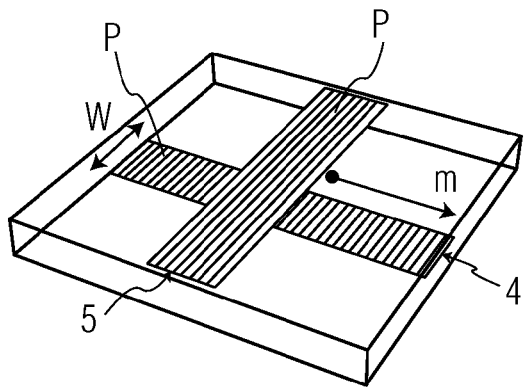
Figure 4C:
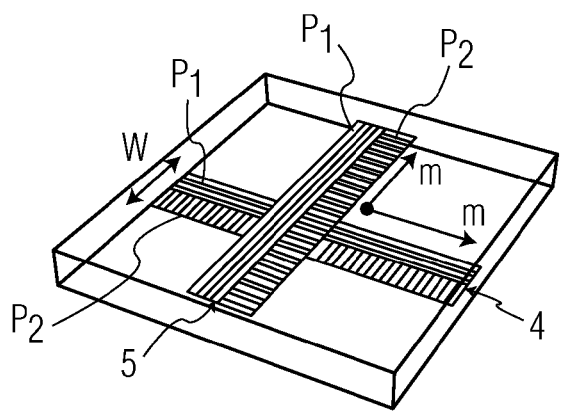
Figure 4D:
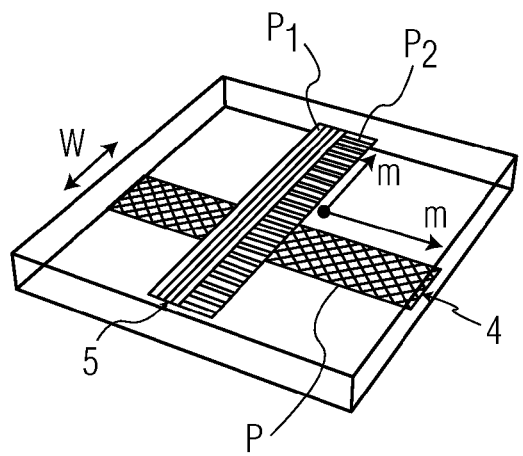
Figure 4E:
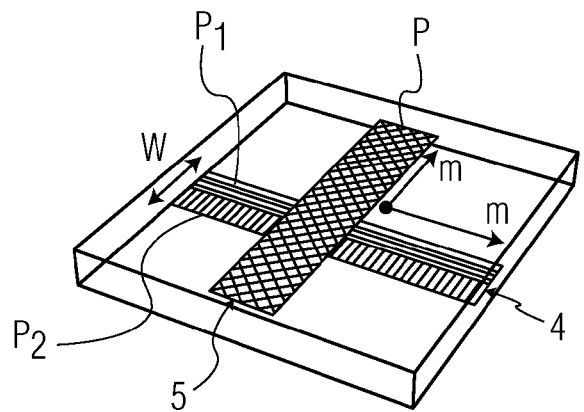
Figure 4F:
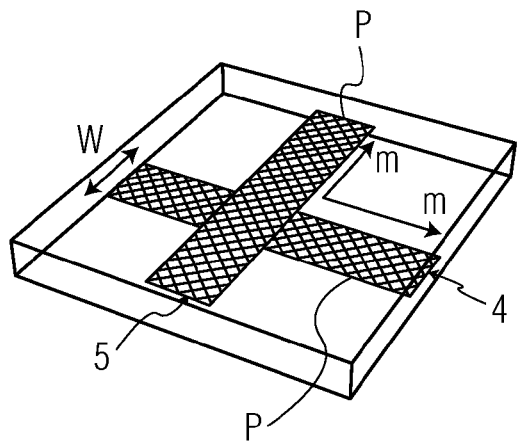

FIGS. 1-3 show schematic embodiments of a system 1 for detection motion of a body 2 comprising a surface 3. Directions x and y define the orthogonal components of all translations in the plane of the surface 3 of the body 2. The z-direction defines the orthogonal component of the out-of-plane translation.

It should be noted that in the FIGS, a single beam in fact may represent a set of beams.

The system 1 is adapted to detect motion of the body 2 and preferably to detect or measure the displacement of the body 2 in one or both of the directions x, y. The arrow M defines the direction in which displacement of the body 2 can be detected or measured as will be further described with reference to FIGS. 4A-4F. For this purpose, the system 1 comprises a first elongated grating strip 4 coupled to the body 2 and a separate and substantially stationary second elongated grating strip 5 crossing said first elongated grating strip. The second grating strip 2 may be stationary arranged at an appropriate position within the system 1 and may also be referred to as a reference grating. It should be appreciated that, while the first grating strip 4 and the second grating strip 5 cross perpendicularly, any angle between the strips may be applied. Furthermore, it should be appreciated that a distance is provided in the z-direction between the body coupled grating strip 4 and the stationary grating strip 5.

By the use of separate gratings 4,5, these gratings can be strip-shaped, even if the body 2 has large in-plane translation ranges. Instead of having to use a grating with large lateral extent in two directions over the entire surface 3 of the body 2, as with the existing systems, relatively narrow grating strips 4,5 can be used. The lengths of these grating strips 4,5 may be about equal to the two in-plane translation ranges in the x,y directions and their widths are about equal to the spot size of the light beams employed for the motion detection.

Optical detection means 6 are provided to detect light beams diffracted from the first and second grating strip 4,5. From these diffracted beams, e.g. by measuring the $+1^{st}$ and $-1^{st}$ diffraction order, it is possible to detect and preferably measure, displacement of the body 2 in a known manner.

In FIG. 1, the optical detection means 6 is movable, indicated by arrow B, by transport means (not shown) along and with respect to the stationary second grating strip 5, such that the optical detection means 6 remains above the overlap area O of the first elongated grating strip 4 and the second elongated grating strip 5. As the overlap area is relative large (e.g. 100 mm$^2$), the transport means may move the optical detection means 6 such that it remains above the overlap area O even if the body 2 is translated over its full in-plane range with considerable accelerations as encountered e.g. in semiconductor wafer processing. As long as the optical detection means 6 is located above the overlap area O, the actual position of the optical detection means 6 does not influence the accuracy of the measurement of the displacement of the body 2.

In the embodiment of FIG. 1, the first grating strip 4 is reflective and the second grating strip 5 is transmissive. Consequently, the optical detection means 6 may receive diffracted light beams of the first and second grating strip 4,5.

In FIG. 2, the optical detection means 6 is stationary with respect to the second grating strip 5. One or more light beams L are directed from the optical detection means 6 to a redirection means 7, such as a mirror or a prism, on top of which the first grating strip 4 is mounted. The redirection means 7 is coupled to the body 2 by a coupling means 8. The first grating strip 4 is transmissive, whereas the second grating strip 5 is reflective. Light beams leaving the optical detection means 6 are directed by the redirection means 7 to reach the overlap area O of the first and second grating 4, 5 and diffracted light beams from these gratings are received at the optical detection means 6 to detect motion of the object 2. The embodiment of FIG. 2 is advantageous in that an arrangement for motion of the optical detection means 6 may be omitted.

In FIG. 3, a combination of the systems of FIGS. 1 and 2 is displayed.

FIGS. 4A-4F depict various types of first gratings strips 4 and second grating strips 5. The arrows M indicate the directions wherein the grating patterns P of the strips 4,5 are periodic and, consequently, indicate the directions in which in-plane translations of the object to which the first grating strip 4 is coupled can be detected or measured. Thus, the grating patterns P of the strips 4,5 of FIGS. 4A and 4B allow motion detection in only one in-plane direction y,x respectively, whereas the grating patterns P of the strips 4,5 in FIGS. 4C-4F allow motion detection in both in-plane directions x,y. While the strips 4,5 in FIG. 4C each have two differently oriented grating patterns P1, P2, at least one of the strips 4,5 of FIGS. 4D-4F have a single grating pattern P periodic in both the x- and y-direction, in this case a checkerboard pattern.

The length L in the direction of elongation of the strips 4,5 preferably covers the full translation range of the object 2 and may be in the range of 5-100 cm, such as 30 cm or 50 cm. The width W of the elongate grating strips 4,5 preferably exceeds the diameter of the light beams for the optical detection system 6, but should be kept as small as reasonably possible since it is advantageous to keep the area covered by the grating as small as possible. As an example, the width W in the transverse direction of the strips 4,5 is smaller than 10 mm, such as 5 mm. The period of the grating pattern P is in the range of 100 nm-50 m, such as 2 m. Only a few periods of the grating strips 4,5 are shown. The periodic pattern may e.g. be obtained by etching the pattern in a glass substrate.

Figure 5:
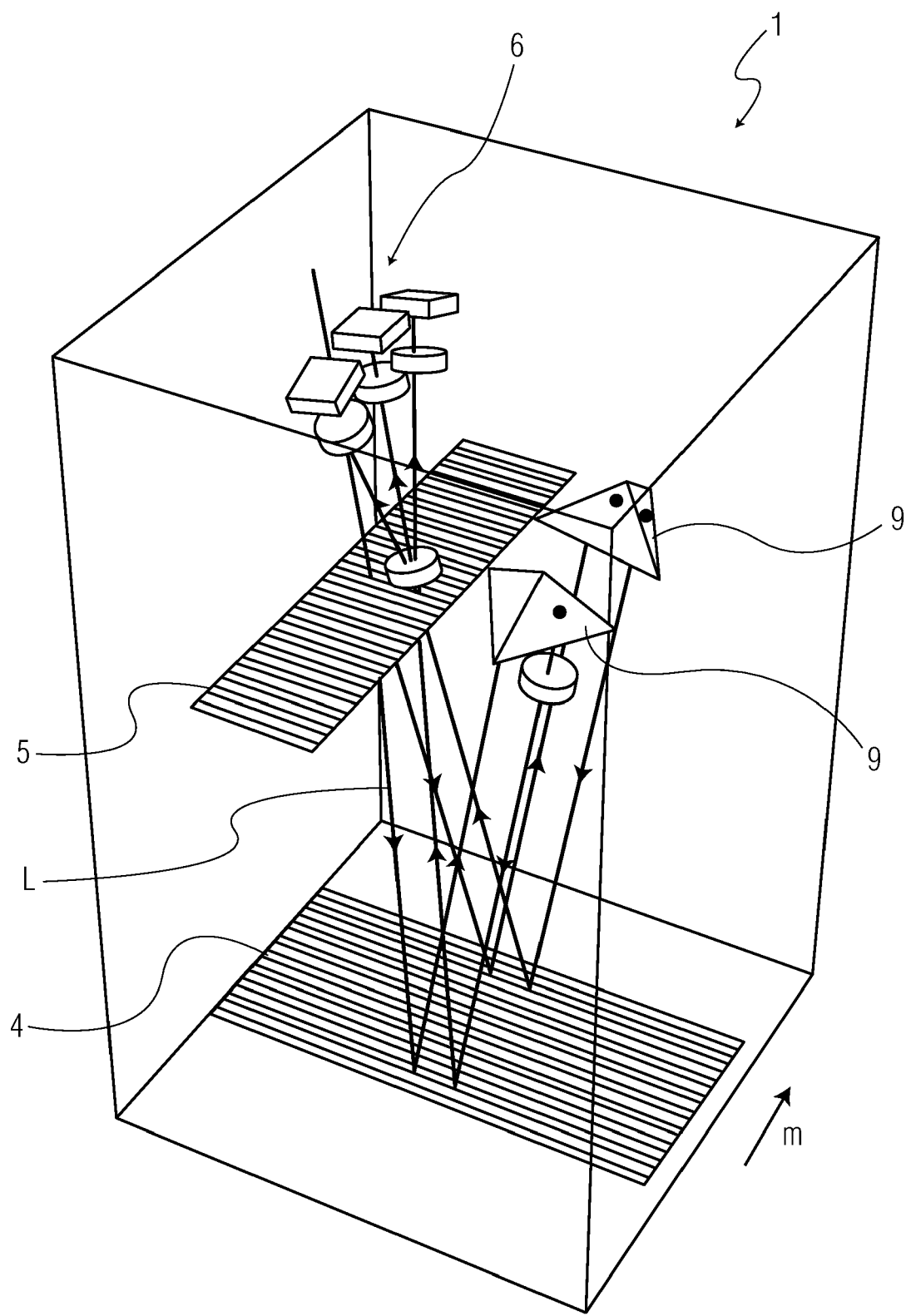
FIGS. 5 and 6 show schematic examples of systems according to the embodiment of FIG. 1 for detecting motion of an object in respectively one and two directions
Figure 6:
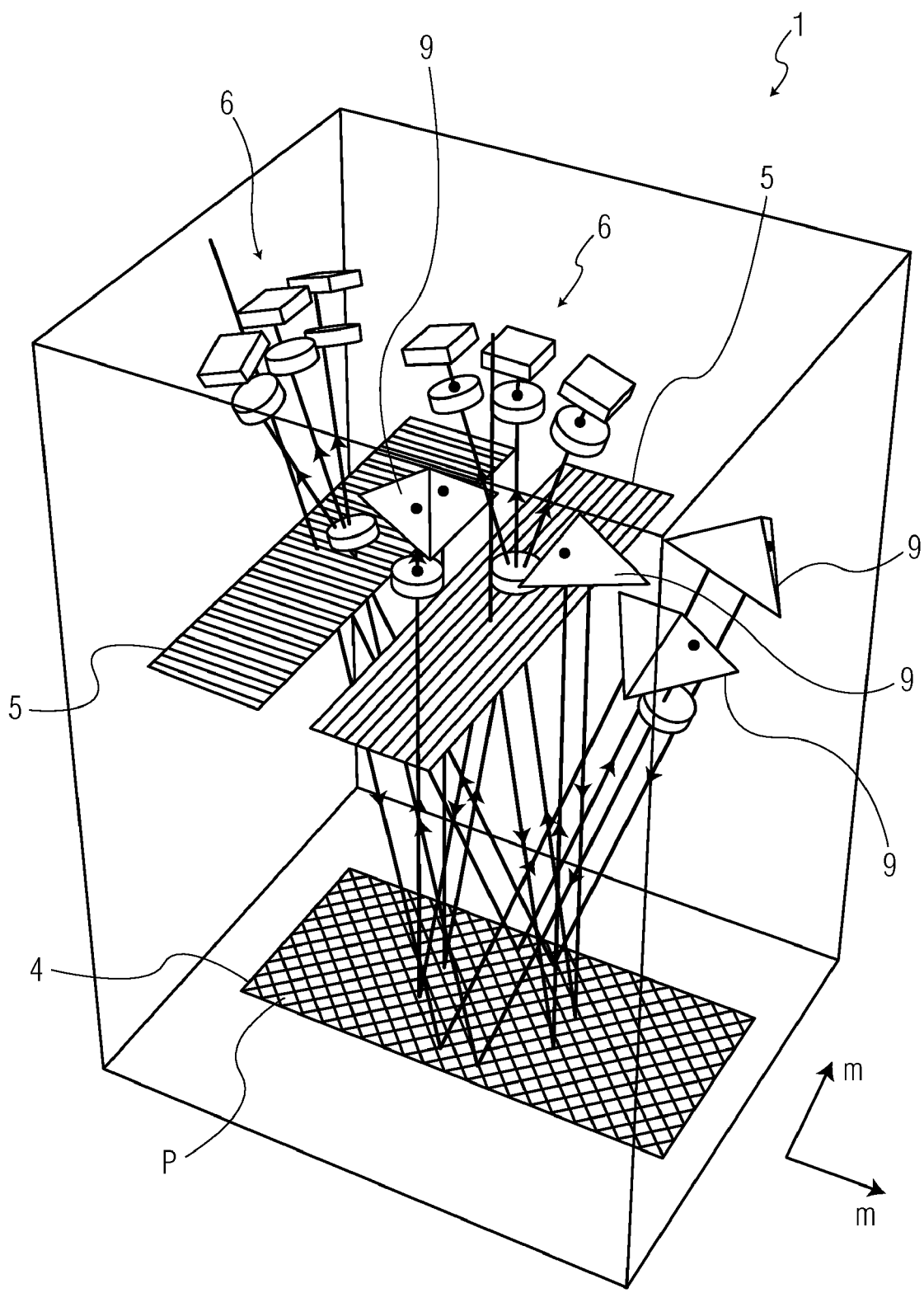

FIGS. 5 and 6 show schematic examples of systems 1 according to the embodiment of FIG. 1 for detecting motion of the object 2 (not shown) in respectively one and two directions x,y. Identical or similar components are indicated by identical reference numerals.

In FIG. 5, an incoming light beam L is diffracted through the transmissive second grating strip 5 and diffracted at the reflective first grating strip 4. The second stationary grating strip 5 is a separate component and not part of the optical detection means 6. Diffracted light beams are subsequently redirected back towards the first grating strip 4 by a retro-reflector 9, e.g. a cube corner. It should be appreciated that corner prisms or cat's eye reflectors may also be used. The retro-reflector 9 may compensate for in-plane and out-of-plane rotation of the grating 4 as well as rotation of the optical detection means 6. These light beams diffract and a reflected back through the second grating strip 5 and received by the optical detection means 6. Since the first grating strip 4 is coupled to the object and, consequently, motion of the object would result in a shift of light beams, the optical detection means is arranged to be movable along the second grating strip in order to receive the light beams.

FIG. 6 illustrates an alternative example enabling displacement detection or measurement system 1 enabling detection of both in-plane translations. Two optical detection means 6 are used, movable along the respective second grating strips 5. For the first grating strip 4, a checkerboard grating pattern P is used, such that the space claim of at the side of the body 2 is reduced. It should be appreciated that the grating strips 4,5 displayed in FIGS. 4C-4F and other types of grating strips allowing detection of both in-plane translation may be employed as well.

FIGS. 7-11 show schematic examples of the system 1 according to the embodiment of FIG. 2 for detecting motion of an object 2 in one direction x or y. FIG. 12 shows a schematic example of a system 1 according to the embodiment of FIG. 2 for detecting motion of an object 2 in two directions x,y. Identical or similar components are indicated by identical reference numerals.

Figure 7:
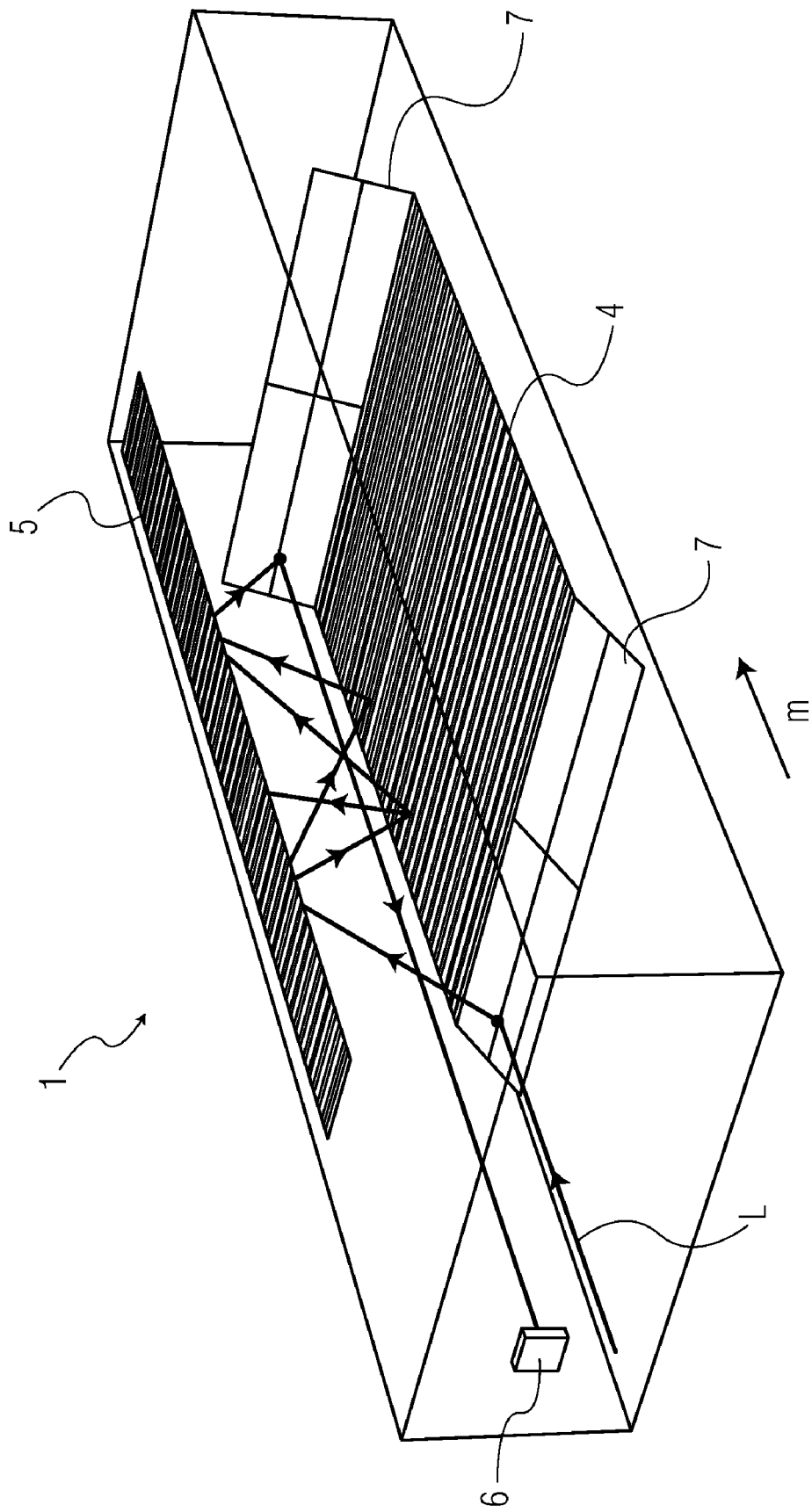
FIGS. 7-11 show schematic examples of a system according to the embodiment of FIG. 2 for detecting motion of an object in one direction.

In FIG. 7, a light beam L is directed to the first and second elongated grating strips 4, 5 by means of redirection means 7. Both grating strips 4,5 are reflective. At the optical detection means 6, the light beam diffracted in the overlap area of the strips 4,5 is received and displacement of the body 2 to which the first grating strip 4 is coupled can be detected or measured for displacement along the arrow M.

Figure 8:
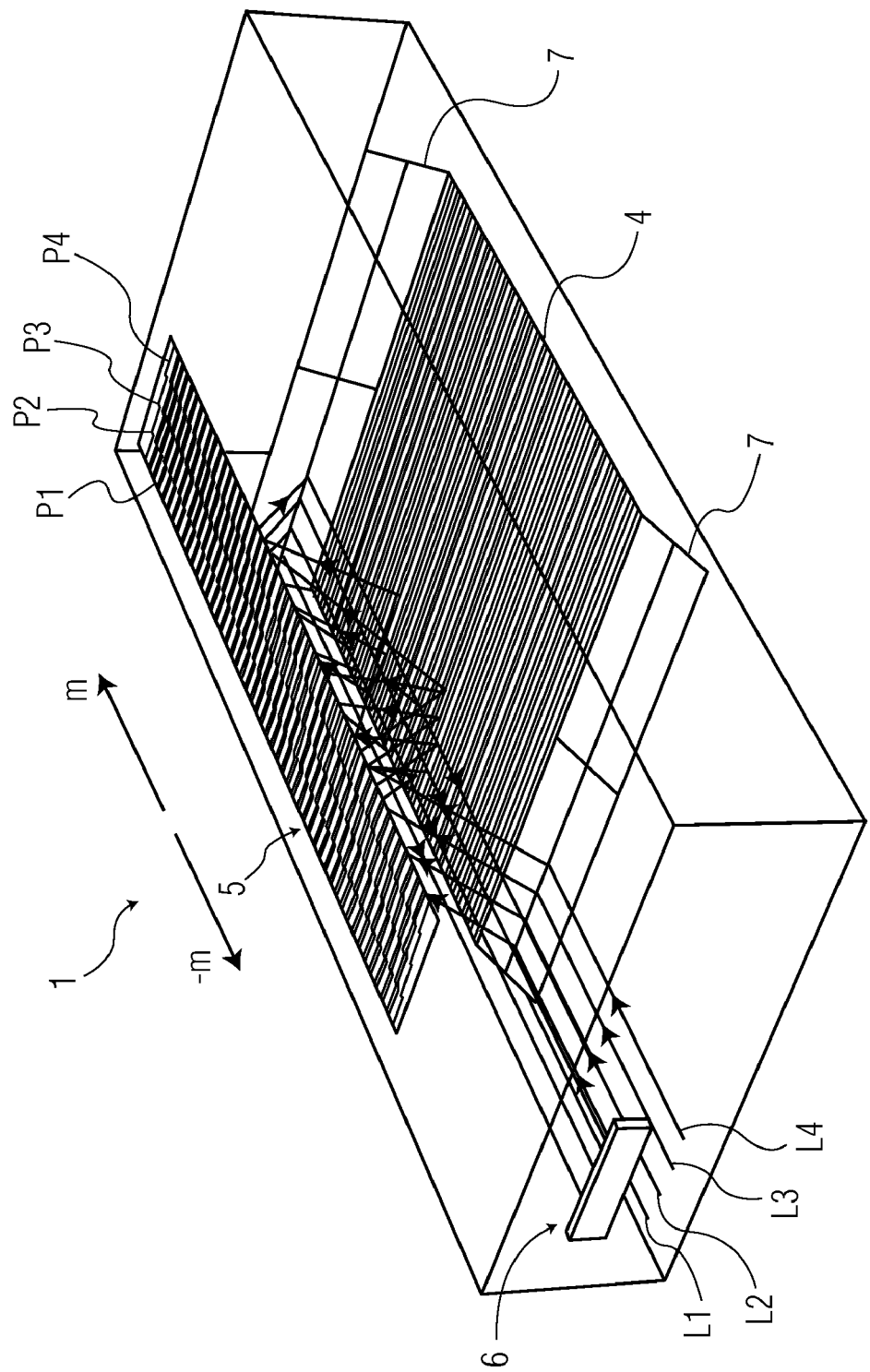

FIG. 8 shows an example of a system 1 similar to that of FIG. 7 except for the second grating strip 5 that has four grating patterns P1-P4 periodic in the same direction along arrow M with a phase difference between said patterns. Light beams L1-L4 are directed towards each of these grating patterns P1-P4 and the multiply diffracted beams for each of the patterns P1-P4 are received at the optical detection means. This embodiment allows determination of the direction of motion, i.e. along arrow M or −M, of the object 2 and a reduced sensitivity to power fluctuations in the incident light beams L.

Figure 9:
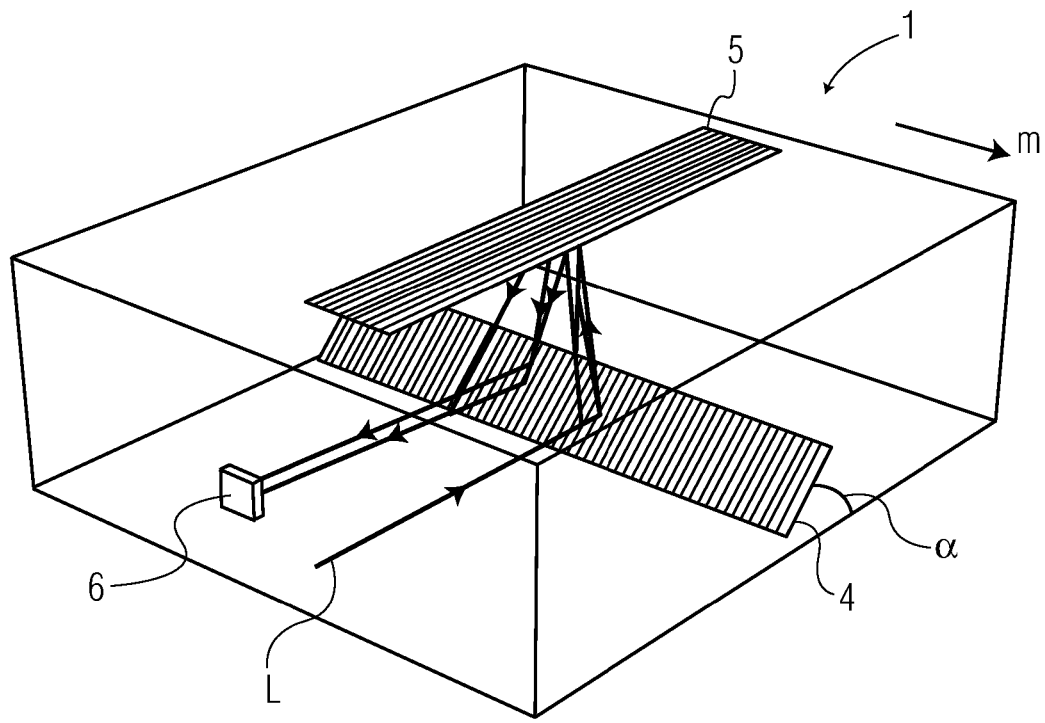
Figure 10:
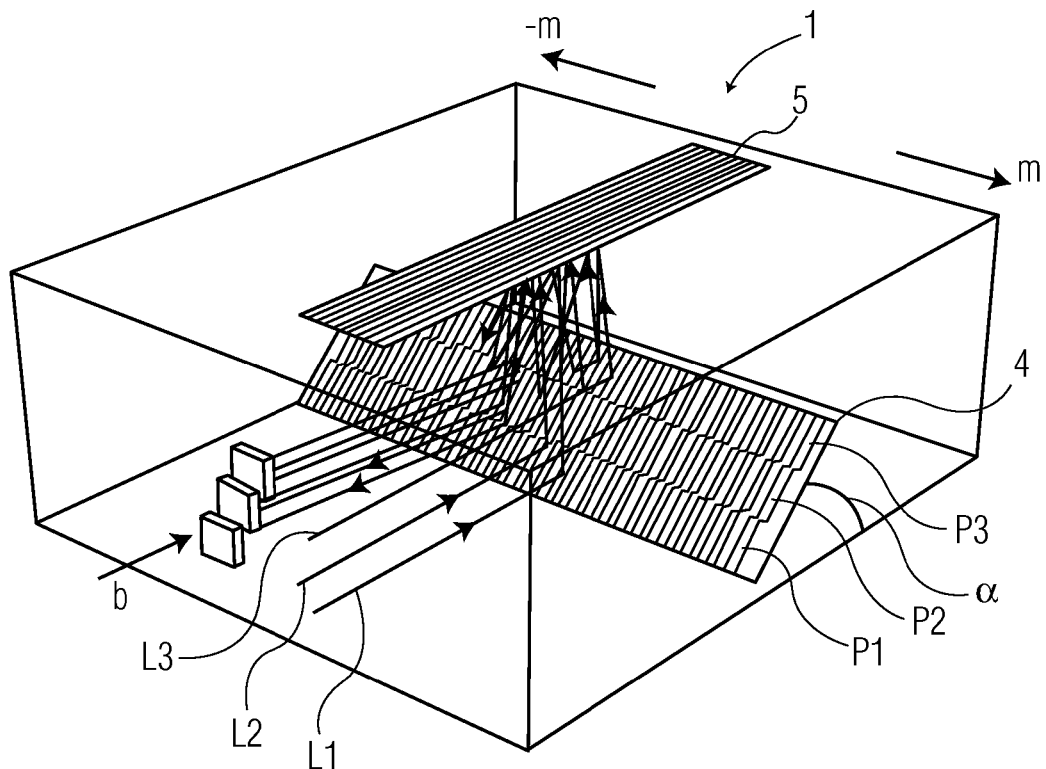

FIGS. 9 and 10 illustrate systems 1 similar to the systems 1 of FIGS. 7 and 8. However, instead of applying redirection means 7, the first elongated and reflective grating strip 4 is positioned under an angle chosen such that the light beam L in FIG. 9 and light beams L1, L2, L3 in FIG. 10 are appropriately diffracted towards the second elongated grating strip 5. Consequently, separate redirection means 7 are no longer required. In FIG. 10, the first grating strip 4 further comprises three grating patterns P1-P3 periodic in the same direction along arrow M with a phase difference between said patterns. Consequently, determination of the direction of motion, i.e. along arrow M or −M, of the object 2 and a reduced sensitivity to power fluctuations in the incident light beams L.

Figure 11:
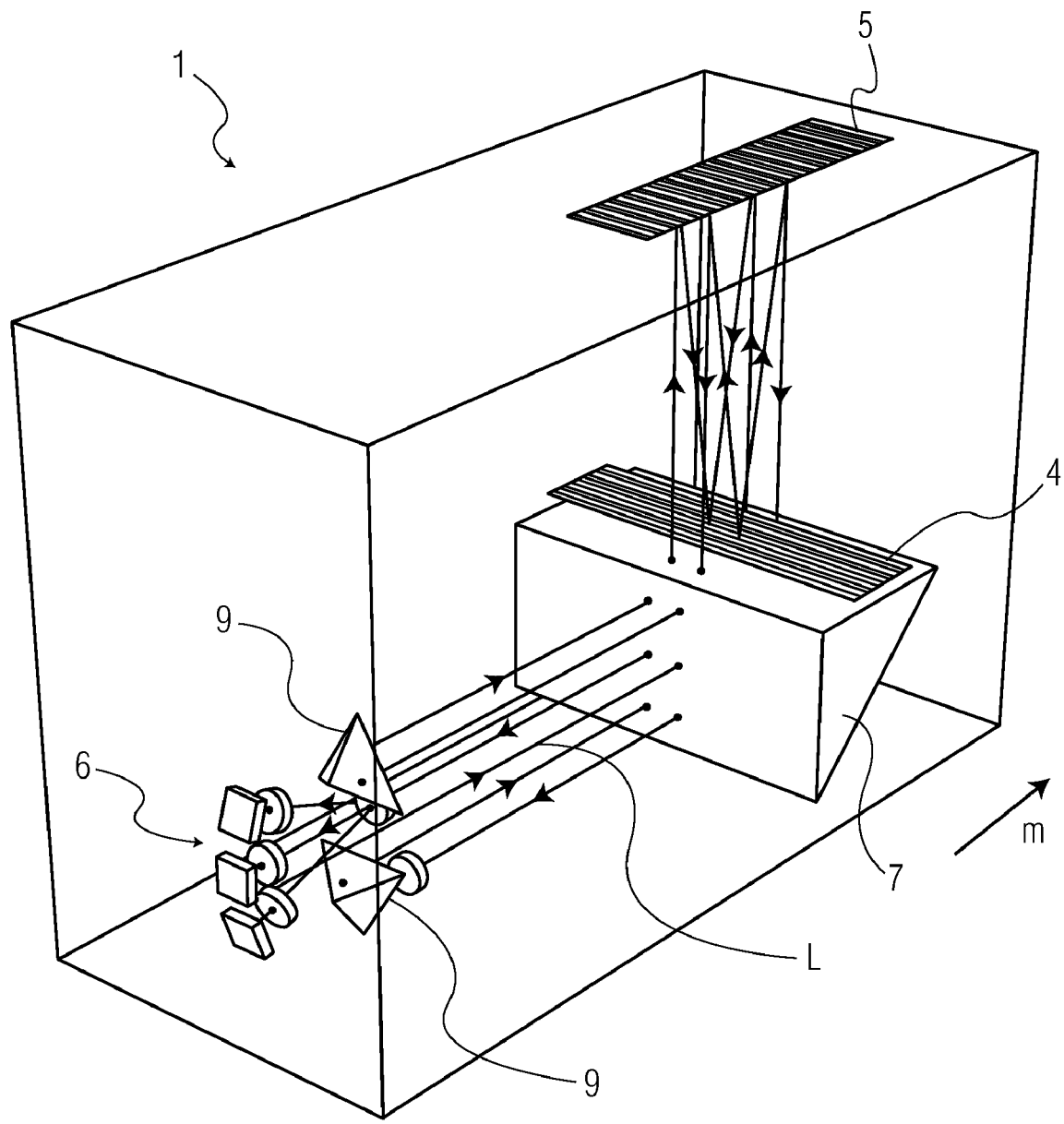
Figure 12:
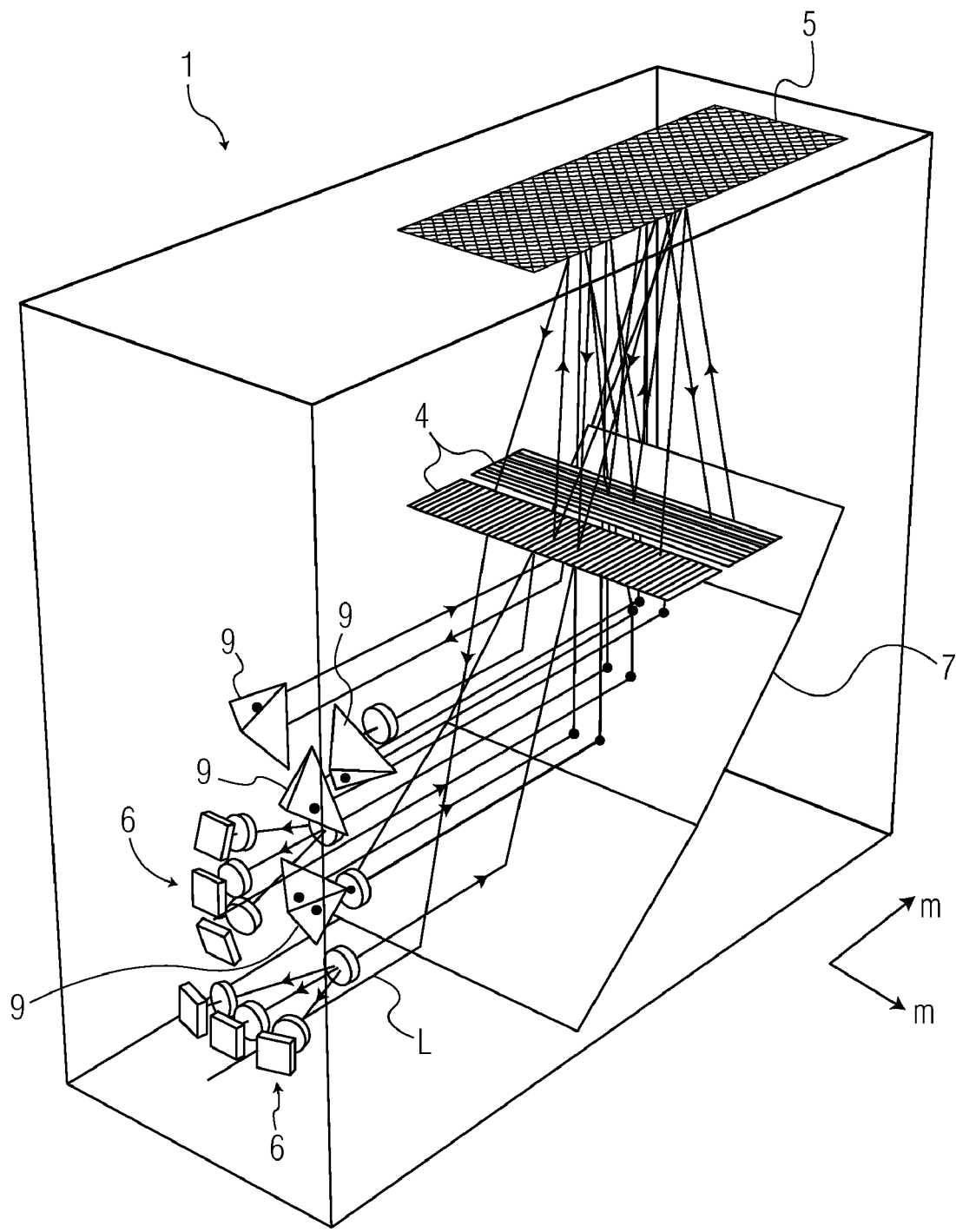
FIG. 12 shows a schematic example of a system according to the embodiment of FIG. 2 for detecting motion of an object in two directions.

FIG. 11 shows a system 1, wherein the first elongated grating strip 4 is applied on top of a prism 7 and retro-reflectors 9 are applied near the stationary optical detection means 6. An incident light beam L is reflected by the prism 7 towards the second grating strip 5 without being diffracted by the first grating strip 4. Only after diffraction at the second grating strip 5, the diffracted light beams are diffracted at the first grating strip 4.

FIG. 12 shows a system 1 enabling displacement detection or measurement of both in-plane translations along the arrows M. Again, identical or similar components are indicated by identical reference numerals and the grating types and arrangements shown in FIGS. 4A-4C or other gratings allowing detection in both in-plane directions can be applied.

Figure 13:
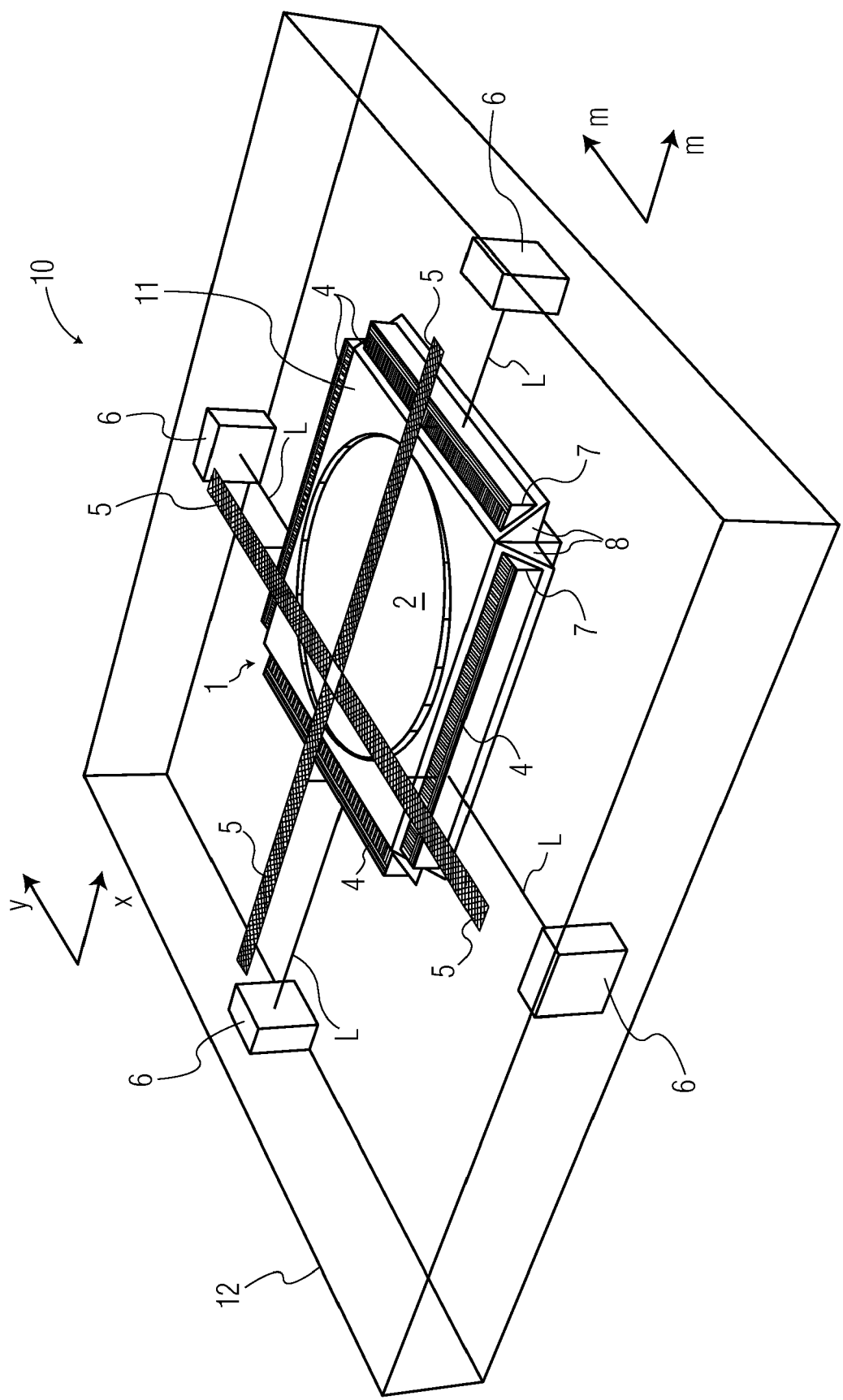
FIG. 13 shows an body processing system comprising a system for detecting motion of an object according to an embodiment of the invention.

FIG. 13 shows a body processing or body inspection system 10, wherein the body 2 is positioned on a table 11 in a chamber 12. The first grating strips 4 are coupled to the body 2. As an example, the body 2 is a wafer placed on a wafer chuck 11 arranged to translate in the x-y plane for processing or inspection purposes. The second grating strips 5 are stationary mounted with respect to the chamber 12, whereas the chamber 12 allows access for processing means or inspection means (not shown) to the body 2.

It is noted that in principle, the second grating strip(s) 5 and corresponding detector(s) 6 may be coupled to a moving chamber 12, whereas the first gratings strip(s) 4 are coupled to a steady table 11.

Clearly, the system 1 for detecting or measuring the displacement of the body 2 is redundant, which may be advantageous for some applications. For example, in case the body 2 is not a rigid body, this redundancy may be advantageous. If the body expands due to temperature changes, and the body displacements is measured on both sides of the body, the expansion of the body can be determined as well as its displacement. Or, if the body deforms under actuation due to limited stiffness, then the deformation can be determined with the help of the redundant measurements. The measured deformation can also be used to correct the measured position the data can be used to control actuators (not shown) that can put forces on the body such that the deformation is eliminated.

It should be appreciated that other embodiments have been envisaged by the applicant, including embodiments using only transmissive or only reflective grating strips. Furthermore, it should be appreciated that the phase stepped grating patters of FIGS. 8 and 10 may comprise three or more than four patterns P. If the phase of sinusoidal signal with an unknown offset and amplitude is to be determined, at least three measurements are required. The three samples of the sinusoidal signal can be used to determine the phase, amplitude, and offset of the signal. Using three or more samples allows determination of the phase without knowledge of the of the amplitude and reduced sensitivity to power fluctuation is obtained. Furthermore, the distance between the first grating strip 4 and the second grating strip 5 may be measured or detected using known interferometry.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A system (1) for detecting motion of a body (2) comprising:
    a first reflective elongated grating strip (4) coupled to said body elongated in a single dimension, wherein a length in the direction of said elongation of said first reflective elongated grating strip (4) covers the full translation range of the body (2) and a transverse dimension of said first reflective elongated grating strip (4) is larger than one or more light beams diffracted at said first elongated grating strip (4) to detect motion of said body
    a separate substantially stationary second transmissive elongated grating strip (5) elongated in a single dimension and positioned above and proximal to said first reflective elongated grating strip separated by an air gap and crossing said first elongated grating strip in a transverse direction, wherein a length in the direction of elongation of said second transmissive elongated grating strip (5) covers the full translation range of the body (2) and a transverse dimension of said second transmissive elongated grating strip (5) is larger than said one or more light beams diffracted at said first elongated grating strip (4) to detect motion of said body,
    wherein said first (4) and second (5) grating strips allow for all orders of diffraction from said body,
    wherein said system further comprises optical detection means (6) arranged to receive said one or more light beams diffracted at said first and second elongated grating strips to detect motion of said body.

2. The system (1) according to claim 1, wherein said system comprises transport means arranged to move said optical detection means with respect to said stationary second elongated grating strip (5).

3. The system (1) according to claim 1, wherein said optical detection means (6) is substantially stationary arranged within said system, said system further comprising light redirection means (7) enabling said optical detection means to receive said light beams.

4. The system (1) according to claim 1, wherein said optical detection means (6) comprises a first stationary detection means and a second movable detection means.

5. The system (1) according to claim 1, wherein said first and second elongated grating strips (4,5) comprise grating patterns (P) periodic in one or more orthogonal directions.

6. The system (1) according to claim 1, wherein at least one of said first and second elongated grating strips (4,5) comprises grating patterns (P) periodic in one or more orthogonal directions and one of said strips has at least two grating patterns (P1-P4; P1-P3) periodic in the same direction with a phase difference between said patterns.

7. The system (1) according to claim 1, wherein a first normal of a plane comprising said first elongated grating strip (4) makes an angle with a second normal of a plane comprising said second elongated grating strip (5).

8. The system (1) according to claim 1, wherein said system further comprises a retro-reflection means (9) for redirecting an incident light beam into substantially the opposite direction.

9. The system (1) according to claim 1, wherein said first grating strip (4) is transmissive and second grating strip (5) comprises a reflective grating.

10. The system (1) according to claim 1, wherein said first grating strip (4) and said second grating strip (5) extend in a first direction and a second direction respectively, said first direction and second direction being perpendicular with respect to each other.

11. The system (11) according to claim 1, wherein said first grating strip and second grating strip have a transverse dimension (W) smaller than 10 mm.

12. A body processing and/or inspection system (10) comprising:
    a processing and/or inspection chamber (12) accommodating a body positioning table (11) for said body,
    wherein a first reflective elongated grating strip (4) is mounted on said body positioning table elongated in a single dimension, wherein a length in the direction of said elongation of said first reflective elongated grating strip (4) covers the full translation range of the body (2) and a transverse dimension of said first reflective elongated grating strip (4) is larger than one or more light beams diffracted at said first elongated grating strip (4) to detect motion of said body
    and
    wherein a second transmissive elongated grating strip (5)) is elongated in a single dimension and positioned above and proximal to said first reflective elongated grating strip separated by an air gap and crossing said first elongated grating strip in a transverse direction, wherein a length in the direction of elongation of said second transmissive elongated grating strip (5) covers the full translation range of the body (2) and a transverse dimension of said second transmissive elongated grating strip (5) is larger than said one or more light beams diffracted at said first elongated grating strip (4) to detect motion of said body,
    wherein said second transmissive elongated grating strip (5) crosses said first elongated grating strip in a transverse direction, wherein said second transmissive elongated grating strip (5) is mounted substantially stationary with respect to said chamber, wherein said first and second elongated grating strip and said optical detection means being arranged such that motion of said body positioning table can be detected.

13. A method for detecting motion of a body (2) in a system (1) comprising;

a first reflective elongated grating strip (4) coupled to said body elongated in a single dimension, wherein a length in the direction of said elongation of said first reflective elongated grating strip (4) covers the full translation range of the body (2) and a transverse dimension of said first reflective elongated grating strip (4) is larger than one or more light beams diffracted at said first elongated grating strip (4) to detect motion of said body, and a separate and substantially stationary second transmissive elongated grating strip (5) crossing said first elongated grating strip in a transverse direction, wherein a second transmissive, wherein said second transmissive elongated grating strip (5) is elongated in a single dimension and positioned above and proximal to said first reflective elongated grating strip separated by an air gap and crossing said first elongated grating strip in a transverse direction, wherein a length in the direction of elongation of said second transmissive elongated grating strip (5) covers the full translation range of the body (2) and a transverse dimension of said second transmissive elongated grating strip (5) is larger than said one or more light beams diffracted at said first elongated grating strip (4) to detect motion of said body, and optical detection means (6):
providing an incident light beam (L) to said first or second elongated grating strip, and
receiving one or more light beams diffracted from said first and second elongated grating strip at said optical detection means to detect motion of said object, and
moving said optical detection means (6) along said stationary elongated second grating strip (5).

14. The method according to claim 13, wherein at least one of said first and second elongated grating strips (4,5) comprises grating patterns (P) periodic in one or more orthogonal, directions and one of said strips has at least two grating patterns (P1-P4; P1-P3) periodic in the same direction with a phase difference between said patterns, said method further comprising the step of providing an incident light beam (L1-L4; L1-L3) for each of said grating patterns and receiving corresponding light beams diffracted from said grating patterns at said optical detection means (6).

15. A first reflective elongated grating strip (4) and a separate substantially stationary second transmissive elongated grating strip (5), wherein the first reflective elongated grating strip (4) is coupled to a body for detecting the motion of said body (2), the first reflective elongated grating strip (4) being elongated in a single dimension, wherein a length in the direction of said elongation of said first reflective elongated grating strip (4) covers the full translation range of the body (2) and a transverse dimension of said first reflective elongated grating strip (4) is larger than one or more light beams diffracted at said first elongated grating strip (4) to detect motion of said body wherein the separate substantially stationary second transmissive elongated grating strip (5) is elongated in a single dimension and positioned above and proximal to said first reflective elongated grating strip (4) and is separated by an air gap and crosses said first elongated grating strip (4) in a transverse direction, wherein a length in the direction of elongation of said second transmissive elongated grating strip (5) covers the full translation range of the body (2) and a transverse dimension of said second transmissive elongated grating strip (5) is larger than said one or more light beams diffracted at said first elongated grating strip (4) to detect motion of said body, wherein said first (4) and second (5) grating strips allow for all orders of diffraction from said body (2), wherein said first (4) and second (5) grating strips transmit one or more diffracted light beams to an optical detection means (6) arranged to receive said one or more diffracted light beams diffracted at said first and second elongated grating strips to detect motion of said body (2).

16. The elongated grating strip (4,5) according to claim 15, wherein said grating strip comprises a first grating pattern (P2) periodic in the direction of said elongation and a second grating pattern (P1) periodic in the direction of said transverse dimension.

17. The elongated grating strip (4,5) according to claim 16, wherein said grating strip has a single grating pattern (P) periodic in both a direction of said elongation and in the direction of said transverse dimension.

18. The system (1) according to claim 1, wherein said second grating strip (4) is reflective.

19. The system (1) according to claim 1, wherein said first grating strip (4) is transmissive.

20. A system (1) for detecting motion of a body (2) comprising a first reflective elongated grating strip (4) coupled to said body and a separate and substantially stationary second transmissive elongated grating strip (5) crossing said first elongated grating strip in a transverse direction, wherein said system further comprises optical detection means (6) arranged to receive one or more light beams diffracted at said first and second elongated grating strips to detect motion of said body, wherein said system comprises transport means arranged to move said optical detection means with respect to said stationary second elongated grating strip (5).

21. A system (1) for detecting motion of a body (2) comprising a first reflective elongated grating strip (4) coupled to said body and a separate and substantially stationary second transmissive elongated grating strip (5) crossing said first elongated grating strip in a transverse direction, wherein said system further comprises optical detection means (6) arranged to receive one or more light beams diffracted at said first and second elongated grating strips to detect motion of said body, wherein said optical detection means (6) comprises a first stationary detection means and a second movable detection means.

* * * * *